United States Patent
Ding et al.

(10) Patent No.: US 10,354,948 B2
(45) Date of Patent: Jul. 16, 2019

(54) LOSSY MIM CAPACITOR FOR ON-DIE NOISE REDUCTION

(71) Applicant: QUALCOMM Incorporated, San Diego, CA (US)

(72) Inventors: Chong Ding, Cary, NC (US); Carl Hanke, Chapel Hill, NC (US); Douglas Bruce White, Raleigh, NC (US); Stephen Douglas Weitzel, Georgetown, TX (US); Richard LaBarbera, Wake Forest, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/803,439

(22) Filed: Nov. 3, 2017

(65) Prior Publication Data

US 2019/0139889 A1    May 9, 2019

(51) Int. Cl.
*H01L 23/522* (2006.01)

(52) U.S. Cl.
CPC ...... *H01L 23/5223* (2013.01); *H01L 23/5222* (2013.01); *H01L 23/5226* (2013.01); *H01L 23/5228* (2013.01)

(58) Field of Classification Search
CPC ............. H01L 23/5222; H01L 23/5223; H01L 23/5226; H01L 23/5228
See application file for complete search history.

(56) References Cited

U.S. PATENT DOCUMENTS

| 6,061,222 A | 5/2000 | Morris et al. |
| 6,452,251 B1 | 9/2002 | Bernstein et al. |
| 2003/0001284 A1 | 1/2003 | List et al. |
| 2004/0065899 A1 | 4/2004 | Takabayashi et al. |
| 2010/0148304 A1 | 6/2010 | Rahim et al. |
| 2011/0156205 A1* | 6/2011 | Maki .................. H01L 23/5223 257/531 |
| 2011/0234016 A1 | 9/2011 | Shimizu et al. |

(Continued)

FOREIGN PATENT DOCUMENTS

| CN | 204304445 U | 4/2015 |
| WO | WO-2014121636 A1 | 8/2014 |

OTHER PUBLICATIONS

International Search Report and Written Opinion—PCT/US2018/052100—ISA/EPO—dated Mar. 6, 2019.

(Continued)

*Primary Examiner* — Ermias T Woldegeorgis (74) *Attorney, Agent, or Firm* — Loza & Loza/Qualcomm (57) ABSTRACT

According to certain aspects of the present disclosure, a semiconductor die includes a decoupling capacitor between a first interconnect metal layer and a second interconnect metal layer of the die, a first supply rail formed from the second interconnect metal layer, and a resistive metal path coupled between the decoupling capacitor and the first supply rail. The decoupling capacitor may be a metal-insulator-metal (MIM) capacitor. In some embodiments, the resistive metal path includes a plurality of elongated segments, and one or more connecting segments, wherein each of the one or more connecting segments electrically couples a respective pair of the plurality of elongated segments. In some embodiments, the resistive metal path includes multiple vias coupled in series.

17 Claims, 9 Drawing Sheets

(56) References Cited

U.S. PATENT DOCUMENTS

| | | |
|---|---|---|
| 2014/0159200 A1 | 6/2014 | Loke et al. |
| 2014/0367757 A1* | 12/2014 | Jakushokas ............. H01L 28/60 |
| | | 257/306 |
| 2014/0374877 A1 | 12/2014 | Oh et al. |
| 2015/0294970 A1 | 10/2015 | Jakushokas et al. |
| 2017/0104057 A1 | 4/2017 | Voiron et al. |

OTHER PUBLICATIONS

Partial International Search Report—PCT/US2018/052100—ISA/EPO—dated Dec. 14, 2018.

* cited by examiner

LOSSY MIM CAPACITOR FOR ON-DIE NOISE REDUCTION

BACKGROUND

Field

Aspects of the present disclosure relate generally to capacitors, and more particularly, to decoupling capacitors for reducing on-die power supply noise.

Background

Circuits on a die (chip) typically receive power from an external power source via a power distribution network (PDN) that includes supply rails for delivering power to the circuits. The PDN may include on-die decoupling capacitors electrically coupled to one or more of the supply rails for reducing noise on the PDN.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

A first aspect relates to a semiconductor die. The die includes a decoupling capacitor between a first interconnect metal layer and a second interconnect metal layer of the die, a first supply rail formed from the second interconnect metal layer, and a resistive metal path coupled between the decoupling capacitor and the first supply rail. The resistive metal path includes a plurality of elongated segments, and one or more connecting segments, wherein each of the one or more connecting segments electrically couples a respective pair of the plurality of elongated segments.

A second aspect relates to a semiconductor die. The die includes a decoupling capacitor between a first interconnect metal layer and a second interconnect metal layer of the die, a first supply rail formed from the second interconnect metal layer, and a resistive metal path coupled between the decoupling capacitor and the first supply rail, wherein the resistive metal path includes multiple vias coupled in series.

A third aspect relates to a semiconductor die. The die includes a decoupling capacitor between a first interconnect metal layer and a second interconnect metal layer of the die, wherein the decoupling capacitor includes multiple capacitors coupled in parallel. The die also includes a first supply rail formed from the second interconnect metal layer, wherein the first supply rail is coupled to the decoupling capacitor.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
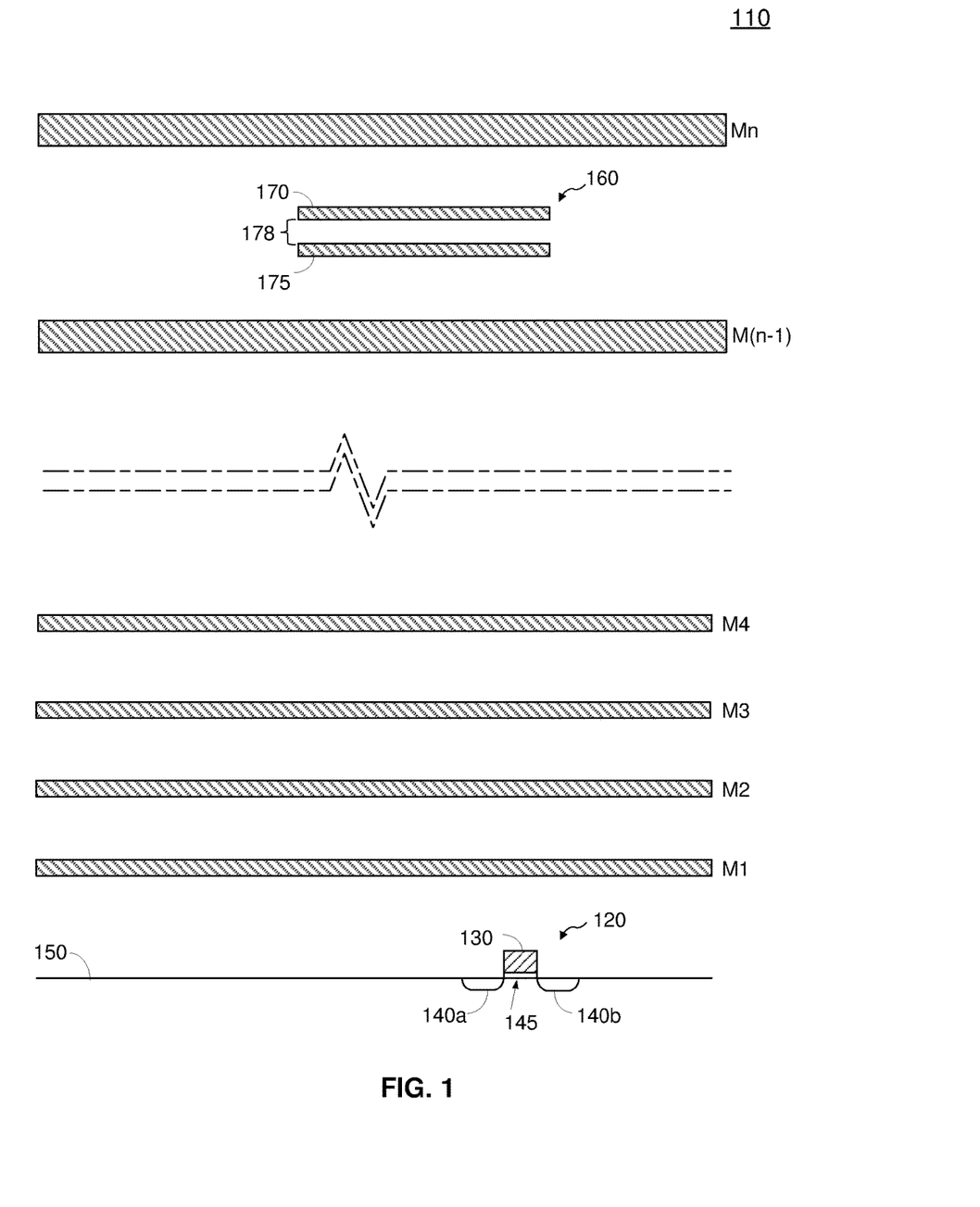
FIG. 1 shows an example of a die including a decoupling capacitor according to certain aspects of the present disclosure.

FIG. 1 shows a side view of an exemplary semiconductor die 110 (also referred to as a chip). The die 110 includes multiple interconnect metal layers in a back end of line (BEOL) of the die 110, in which adjacent interconnect metal layers are separated by one or more insulating layers. The different interconnect metal layers may be interconnected using vias, and/or other structures (not shown in FIG. 1). The bottom-most interconnect metal layer may be labeled M0 or M1. The description below uses the convention in which the bottom-most interconnect metal layer is labeled M1.

In the example shown in FIG. 1, the interconnect metal layer immediately above interconnect metal layer M1 is labeled M2, the interconnect metal layer immediately above interconnect metal layer M2 is labeled M3, and so forth. In this example, the die 110 includes at least n interconnect metal layers, in which the top-most interconnect metal layer shown in FIG. 1 is labeled Mn. The number of interconnect metal layers may be ten or more. Note that the interconnect metal layers between interconnect metal layer M4 and interconnect metal layer M(n−1) are not shown in FIG. 1 for ease of illustration. Also, it is to be appreciated that the die 110 extends farther in the horizontal direction than shown in FIG. 1.

The interconnect metal layers M1 to Mn may be patterned (e.g., using photolithography and etching processes) to form part of a power distribution network (PDN) for delivering power from an external power source (e.g., battery) to devices (e.g., transistors) on the die 110. The interconnect metal layers M1 to Mn may also be patterned to form signal lines for routing signals to/from devices on the die 110. The signals may include digital signals, analog signals, etc. Note that FIG. 1 shows the interconnect metal layers M1 to Mn before patterning for ease of illustration.

The die 110 also includes many devices (e.g., transistors) in a front end of line (FEOL) of the die 110, in which the FEOL is below interconnect metal layer M1. The devices may be fabricated on the substrate 150 of the die 110 using a planar process and/or a non-planar process. The devices may include planar field-effect transistors, FinFETs and/or other types of transistors.

FIG. 1 shows an example of one of the devices in the FEOL of the die 110, in which the device is a transistor 120 (e.g., field effect transistor). The transistor 120 includes a gate 130, a gate dielectric 145 (e.g., gate oxide) between the gate 145 and the channel of the transistor, a first source/drain 140a, and a second source/drain 140b. As used herein, the term "source/drain" indicates that the corresponding structure can act as a source or a drain. Although one transistor 120 is shown in FIG. 1 for ease of illustration, it is to be appreciated that the semiconductor die 110 includes a large number of transistors. FIG. 1 depicts an example of a planar transistor. However, it is to be appreciated that the die 110 may include FinFETs, and/or other types of transistors. The transistors in the FEOL of the die 110 may be coupled to interconnects formed from metal layer M1 using contacts, vias, and/or other structures (not shown in FIG. 1).

As discussed above, devices (e.g., transistors) on the die 110 receive power from an external power source via the PDN. The PDN includes supply rails for delivering power to the devices on the die 110, in which the supply rails are formed from the interconnect metal layers of the die 110. The PDN also includes on-die decoupling capacitors electrically coupled to the supply rails for reducing noise on the PDN. Metal-insulator-metal (MIM) capacitors are commonly used for the decoupling capacitors because of their simplicity. The MIM capacitors may be fabricated on the die 110 between two of the interconnect metal layers in the BEOL of the die 110.

In this regard, FIG. 1 shows an example of a MIM decoupling capacitor 160 located between interconnect metal layers Mn and M(n–1). In this example, the decoupling capacitor 160 includes a top metal plate 170, a bottom metal plate 175, and an insulator (e.g., dielectric) layer 178 between the top and bottom metal plates 170 and 175. The top and bottom metal plates 170 and 175 may be electrically coupled to supply rails formed from metal layer Mn and/or metal layer M(n–1) using vias, and/or other structures (not shown in FIG. 1). As shown in FIG. 1, the decoupling capacitor 160 is located above the FEOL of the die 110 where devices (e.g., transistors) are located. For example, the decoupling capacitor 160 may be located above the FEOL, and separated vertically from the FEOL by at least five intervening interconnect metal layers (i.e., M1-M5) of the die 110. It is to be appreciated that FIG. 1 is not drawn to scale, and that the decoupling capacitor 160 may be much larger than the transistor 120.

In the PDN, inductance from the chip package interacts with capacitance from an on-die decoupling capacitor to form an LC circuit that resonates at a frequency ranging from about 10 MHz to several hundreds of MHz. This causes the PDN to amplify noise at the resonance frequency. The noise at the resonance frequency can be significantly reduced by adding an appropriate amount of resistance to the on-die decoupling capacitor, which dampens the noise. However, a challenge with this approach is that the on-die decoupling capacitor is commonly implemented with a MIM capacitor, which has a very low resistance. As a result, it can be very difficult to add the appropriate amount of resistance to the decoupling capacitor.

To effectively dampen noise at the resonance frequency, it is desirable for a decoupling capacitor to have an RC time constant that is proportional to one over the resonance frequency of the PDN, and is typically a few nanoseconds. A MIM capacitor typically has a capacitance of a few pico-farads (pF), which requires a resistance on the order of a few kilo-ohms to achieve an RC time constant of a few nanoseconds. However, it is difficult to achieve such a high resistance, especially given the fact that a MIM capacitor has very low resistance.

Embodiments of the present disclosure provide techniques for achieving a large enough RC time constant (e.g., a few nanoseconds) for a decoupling capacitor to significantly dampen noise at a resonance frequency of the PDN, as disclosed further below.

In some embodiments, a decoupling capacitor is coupled to a power gird through a resistive metal path in order to achieve a large enough RC time constant to significantly damped noise at the resonance frequency. In these embodiments, the resistive path is implemented using a long-narrow metal path (e.g., having a resistance of a few hundred ohms or higher). The resistance of the metal path is approximately proportional to L/W, where L in the length of the path and W is the width of the path. Thus, the resistance of the metal path may be increased to achieve a desired RC time constant by making the metal path longer and/or narrower (i.e., reducing the width of the metal path).

An example of resistive metal paths will now be discussed with reference to FIGS. 2A to 2C according to certain aspects of the present disclosure.

Figure 2A:
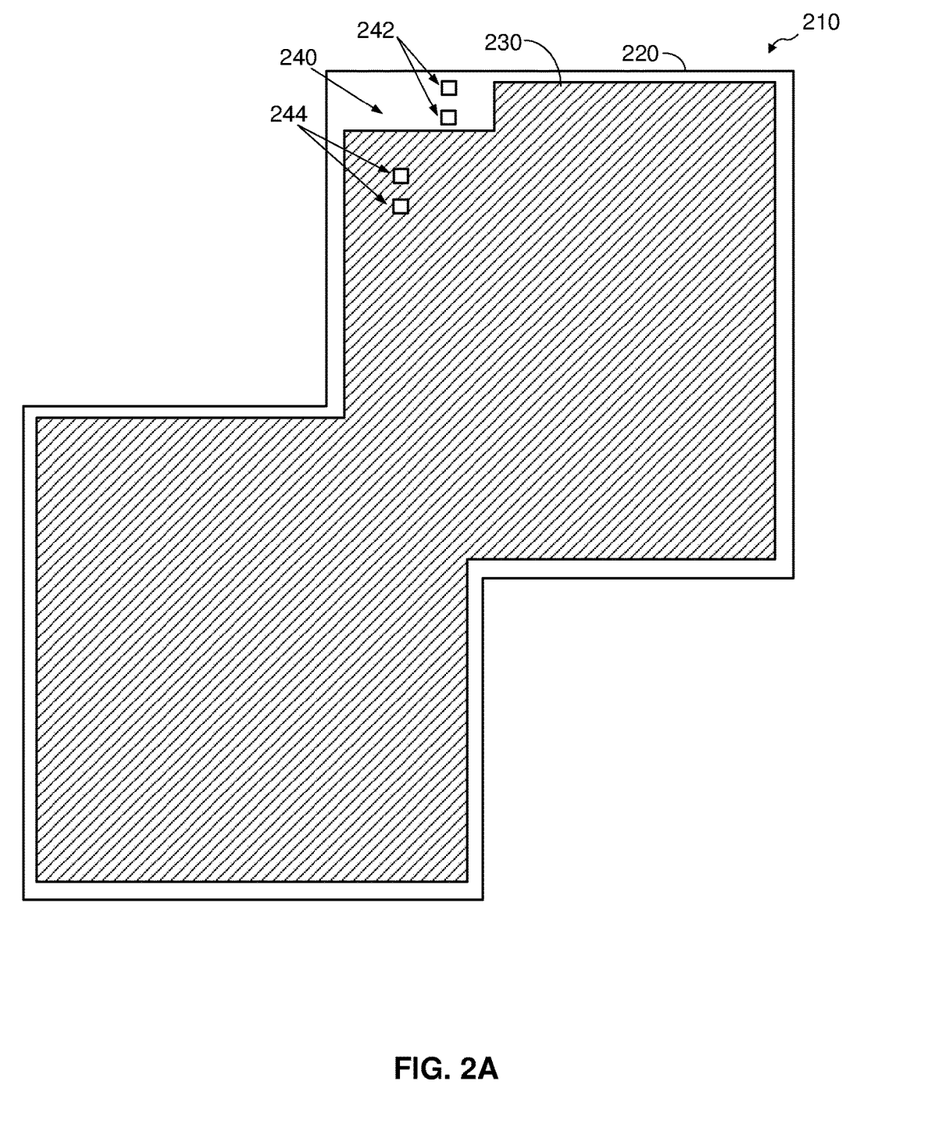
FIG. 2A shows a top view of an exemplary decoupling capacitor according to certain aspects of the present disclosure.

FIG. 2A shows a top view of an exemplary decoupling capacitor 210 according to certain aspects. The decoupling capacitor 210 may be disposed between interconnect metal layers M(n–1) and Mn shown in FIG. 1.

The decoupling capacitor 210 includes a bottom metal plate 220, and a top metal plate 230 located above the bottom metal plate 220. In FIG. 2A, the top metal plate 230 is shaded to better distinguish the top metal plate 230 from the bottom metal plate 220. The decoupling capacitor 210 also includes an insulator (e.g., dielectric) layer between the metal plates 220 and 230. Each of the metal plates 220 and 230 may be formed from a separate metal layer located between interconnect metal layer M(n–1) and interconnect metal layer Mn. In the example shown in FIG. 2A, the boundary of the bottom metal layer 220 extends slightly beyond the boundary of the top metal layer 230.

In the example shown in FIG. 2A, the die 110 includes vias 244 disposed on the top metal plate 230. The vias 244 are used to electrically couple the top metal plate 230 to a first resistive metal path 260 (shown in FIG. 2B), as discussed further below. The die 110 in this example also includes vias 242 disposed on the bottom metal plate 220. The vias 242 are used to electrically couple the bottom metal plate 220 to a second resistive metal path 270 (shown in FIG.

2B). The bottom metal plate 220 includes an extension 240 that extends laterally beyond the boundary of the top metal plate 230. The vias 242 are located on the extension 240 of the bottom metal plate 220. The extension 240 allows the vias 242 to extend vertically to reach interconnect metal layer Mn without hitting the top metal plate 230.

Figure 2B:
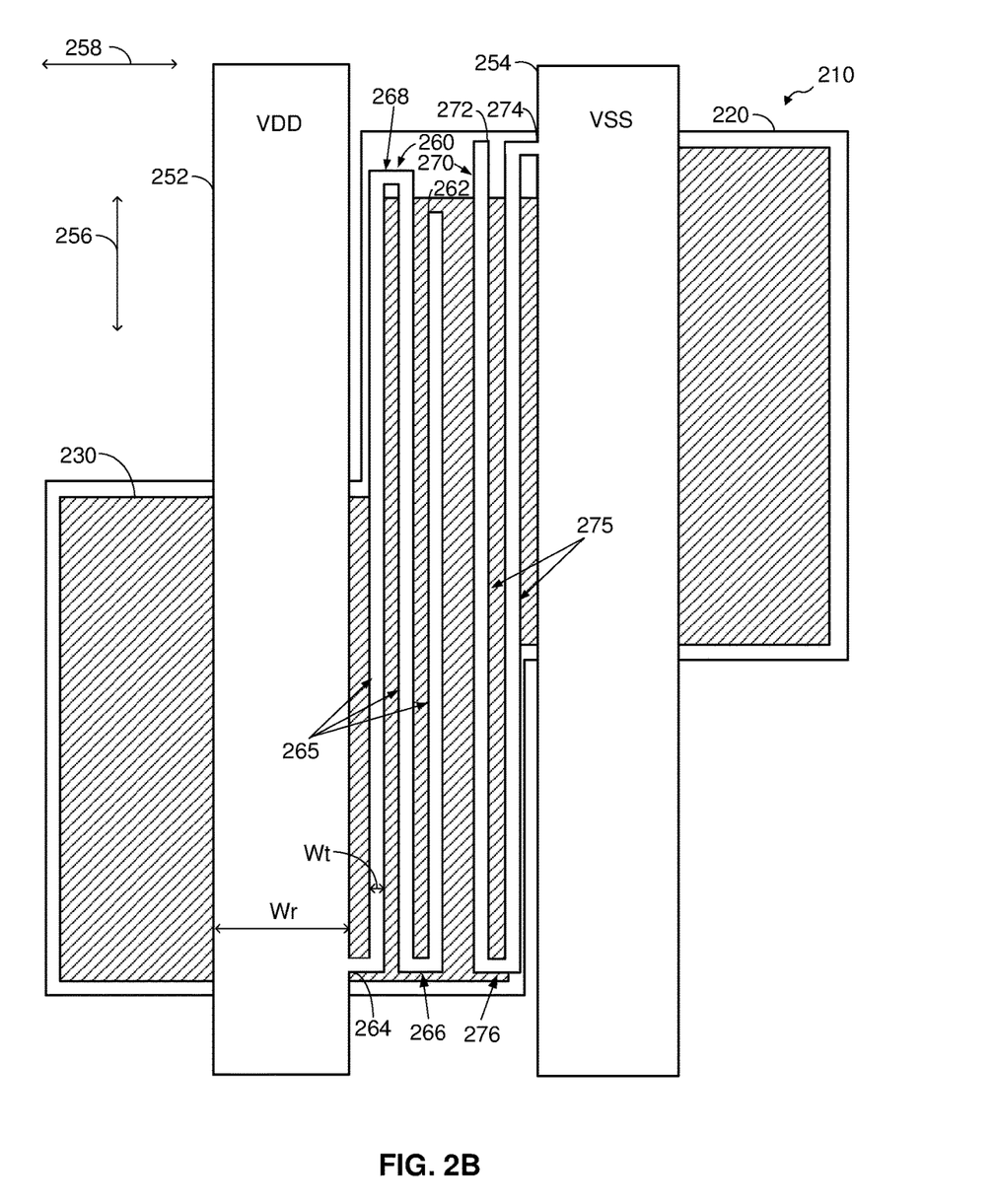
FIG. 2B shows a top view of exemplary resistive metal paths according to certain aspects of the present disclosure.

FIG. 2B shows an example of the first resistive metal path 260 according to certain aspects of the present disclosure. The first resistive metal path 260 may be formed from interconnect metal layer Mn (e.g., using photolithography and etching processes), which is above the top metal plate 230. The first resistive metal path 260 is coupled at one end 262 to the top metal plate 230 by the vias 244 (shown in FIG. 2A), and is coupled at the opposite end 264 to a first supply rail 252. The first supply rail 252 is part of a power grid that distributes a supply voltage VDD (e.g., from an external power source) to different areas of the die 110. In this example, the first supply rail 252 may be referred to as a VDD rail. The first supply rail 252 may be formed from interconnect metal layer Mn (e.g., using photolithography and etching processes). Thus, the first supply rail 252 and the first resistive metal path 260 may be formed from the same metal layer (i.e., interconnect metal layer Mn), in which case, the first supply rail 252 and the first resistive metal path 260 are contiguous.

In the example shown in FIG. 2B, the first resistive metal path 260 includes a winding path that allows the first resistive metal path 260 to have a relatively long length for increased resistance within a compact area. In certain aspects, the first resistive metal path 260 includes multiple elongated segments 265 that run parallel with one another. In the example shown in FIG. 2B, the elongated segments 265 are orientated along lateral direction 256, and are closely spaced together. As used herein, the term "lateral" refers to a direction that is parallel with respect to the substrate 150 of the die 110.

The first resistive metal path 260 also includes connecting segments 266 and 268, in which each of the connecting segments 266 and 268 couples together a respective pair of adjacent elongated segments 265. More particularly, each of the connecting segments couples one end of one of the respective pair of elongated segments to one end of the other one of the respective pair of elongated segments. In the example shown in FIG. 2B, the connecting segments 266 and 268 are orientated along lateral direction 258, which is perpendicular to lateral direction 256.

The first resistive metal path 260 provides a high-resistance connection between the top metal plate 230 of the decoupling capacitor 210 and the first supply rail 252. The high resistance increases the RC time constant associated with the decoupling capacitor 210 for dampening noise at a resonance frequency of the PDN. The resistance of the first resistive metal path 260 may be increased by increasing the length of the first resistive metal path 260 and/or decreasing the width of the first resistive metal path 260.

FIG. 2B also shows an example of the second resistive metal path 270 according to certain aspects of the present disclosure. The second resistive metal path 270 may be formed from interconnect metal layer Mn (e.g., using photolithography and etching processes). The second resistive metal path 270 is coupled at one end 272 to the bottom metal plate 220 by the vias 242 (shown in FIG. 2A), and is coupled at the opposite end 274 to a second supply rail 254. The second supply rail 254 may be operated at a potential VSS that is lower than the potential VDD of the first supply rail 252. For example, the second supply rail 254 may be coupled to ground to provide a ground connection for the devices on the die 110. In this example, the second supply rail 254 may be referred to as a VSS rail. The second supply rail 254 may be formed from interconnect metal layer Mn (e.g., using photolithography and etching processes).

In the example shown in FIG. 2B, the second resistive metal path 270 includes a winding path that allows the second resistive metal path 270 to have a relatively long length for increased resistance within a compact area. In certain aspects, the second resistive metal path 270 includes multiple elongated segments 275 that run parallel with one another. In the example shown in FIG. 2B, the elongated segments 275 are orientated along lateral direction 256, and are closely spaced together. The second resistive metal path 270 includes a connecting segment 276 that couples two adjacent elongated segments 275.

The second resistive metal path 270 provides a high-resistance connection between the bottom metal plate 220 of the decoupling capacitor 210 and the second supply rail 254. The high resistance increases the RC time constant associated with the decoupling capacitor 210 for dampening noise at a resonance frequency of the PDN. The resistance of the second resistive metal path 270 may be increased by increasing the length of the second resistive metal path 270 and/or decreasing the width of the first resistive metal path 270.

Although two resistive metal paths 260 and 270 are shown in the example in FIG. 2B, it is to be appreciated that one of the resistive metal paths may be omitted. For example, the second resistive metal path 270 may be omitted. In this example, the extension 240 of the bottom metal plate 220 may extend under the second supply rail 254, and the vias 242 (shown in FIG. 2A) may be repositioned between the extension 240 and the second supply rail 254 to couple the bottom metal plate 220 to the second supply rail 254. In another example, the first resistive metal path 260 may be omitted. In this example, the vias 244 (shown in FIG. 2A) may be repositioned between the top metal plate 230 and the first supply rail 252 to couple the top metal plate 230 to the first supply rail 252.

Also, it is to be appreciated that the elongated segments 265 and connecting segments 266 and 268 of the first resistive metal path 260 are not limited to the exemplary orientations shown in FIG. 2B. For example, the elongated segments 265 may be orientated along lateral direction 258 and the connecting segments 266 and 268 may be orientated along lateral direction 256. The same applies to the elongated segments 275 and connecting segment 276 of the second resistive metal path 270.

In the example discussed above, the first supply rail 252 is a VDD rail and the second supply rail 254 is a VSS rail. However, it is to be appreciated that the present disclosure is not limited to this example. For example, the first supply rail 252 may be a VSS rail and the second supply rail 254 may be a VDD rail.

As discussed above, the resistance of the first resistive metal path 260 may be increased by decreasing the width of the first resistive metal path 260. In this regard, the width of the first resistive metal path 260 (labeled "Wt" in FIG. 1) may be much smaller than the width of the first supply rail 252 (labeled "Wr" in FIG. 1). For example, the width of the first resistive metal path 260 may be equal to 20 percent or less of the width of the first supply rail 252. In certain aspects, the width of the first resistive metal path 260 may be close to or equal to the smallest width for interconnect metal layer Mn that is allowed by the semiconductor process used to fabricate the die 110. The width of the second resistive metal path 270 may also be made narrow to increase the resistance of the second resistive metal path 270.

The first supply rail 252 is coupled to supply rails located at lower interconnect metal layers of the die 110 using vias and/or other interconnect structures in order to distribute power from the first supply rail 252 to the devices (e.g., transistors) located in the FEOL of the die 110. In this regard, FIG. 2C shows an example of a third supply rail 282 formed from interconnect metal layer M(n−1), which is below the first supply rail 252 and the decoupling capacitor 210 in this example. The third supply rail 282 extends underneath the first supply rail 252 and the decoupling capacitor 210 in lateral direction 258. The first supply rail 252 is coupled to the third supply rail 282 by multiple vias 292 (e.g., arranged in a matrix). The vias 292 extend between metal layer M(n−1) and metal layer Mn in order to couple the third supply rail 282 to the first supply rail 252. In FIG. 2C, the vias 292 and the portion of the third supply rail 282 underneath the first supply rail 252 are shown with dashed lines.

Figure 2C:
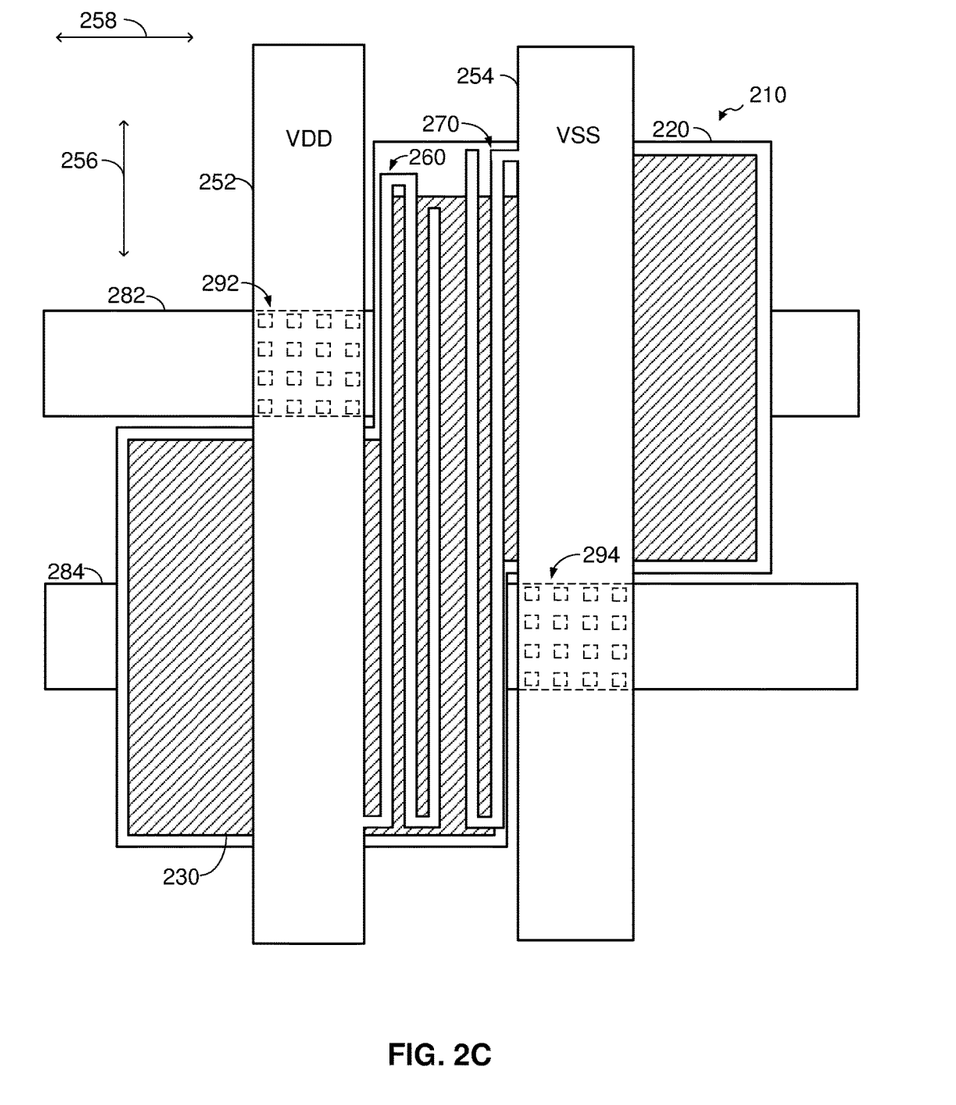
FIG. 2C shows a top view of exemplary supply rails located above and below the decoupling capacitor according to certain aspects of the present disclosure.

FIG. 2C also shows an example of a fourth supply rail 284 formed from interconnect metal layer M(n−1). The fourth supply rail 284 extends underneath the second supply rail 254 and the decoupling capacitor 210 in lateral direction 258. The second supply rail 254 is coupled to the fourth supply rail 284 by multiple vias 294 (e.g., arranged in a matrix). The vias 294 extend between metal layer M(n−1) and metal layer Mn in order to couple the fourth supply rail 284 to the second supply rail 254. In FIG. 2C, the vias 294 and the portion of the fourth supply rail 284 underneath the second supply rail 254 are shown with dashed lines.

In certain aspects, a resistive path is implemented using multiple vias coupled in series. For example, the resistive path may comprise at least three vias coupled in series. In these aspects, the resistance of the resistive path may be increased by increasing the number of vias that are coupled in series, as discussed further below.

An example of a resistive path including multiple vias coupled in series will now be discussed with reference to FIG. 3A according to certain aspects of the present disclosure.

Figure 3A:
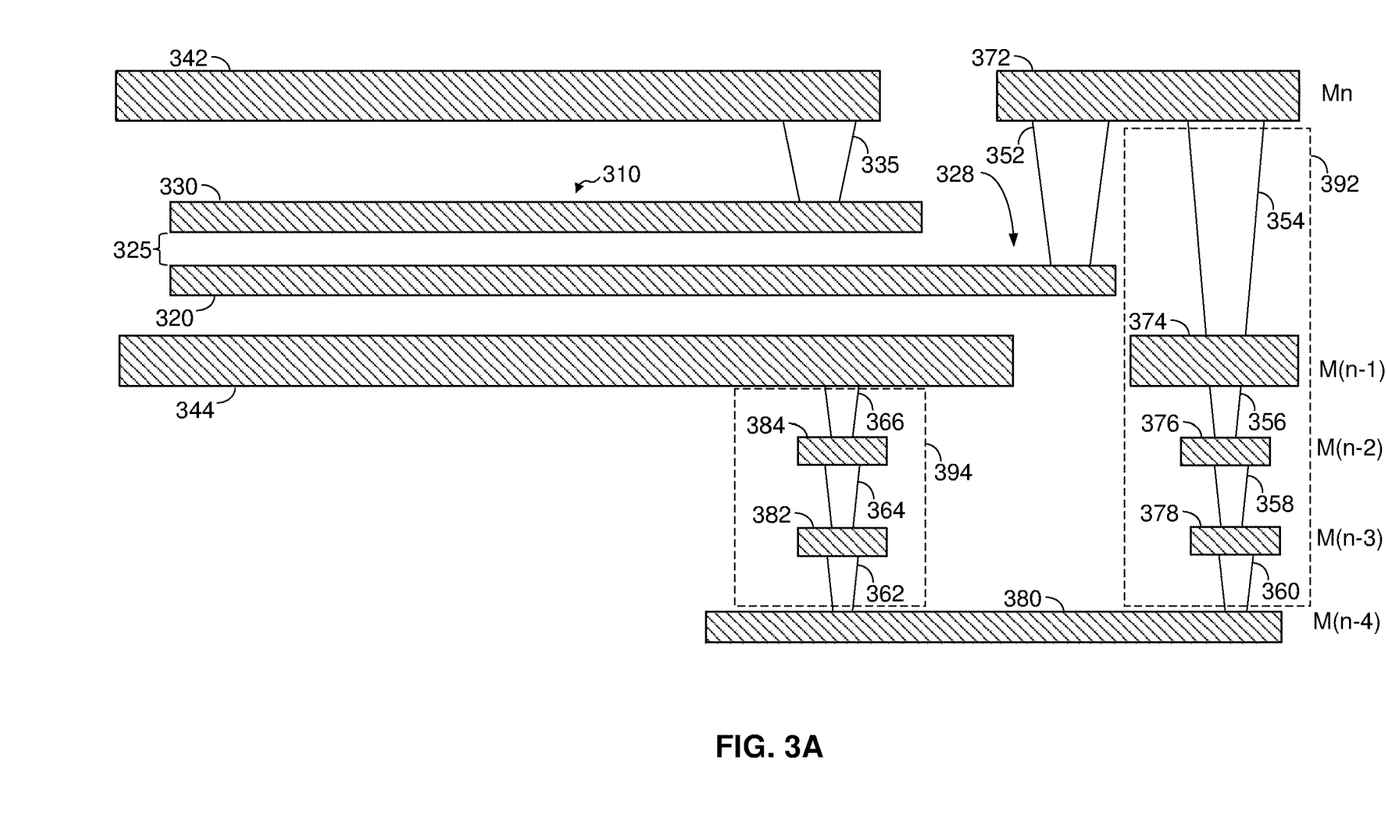
FIG. 3A shows a side view of an exemplary resistive path including multiple vias coupled in series according to certain aspects of the present disclosure.

FIG. 3A shows a side view of an exemplary decoupling capacitor 310 according to certain aspects. The decoupling capacitor 310 may be disposed between interconnect metal layers M(n−1) and Mn.

The decoupling capacitor 310 includes a bottom metal plate 320, and a top metal plate 330 located above the bottom metal plate 320. The decoupling capacitor 310 also includes an insulator (e.g., dielectric) layer 325 between the metal plates 320 and 330. Each of the metal plates 320 and 330 may be formed from a separate metal layer that is located between interconnect metal layer M(n−1) and interconnect metal layer Mn.

FIG. 3A shows a via 335 disposed on the top metal plate 330. The via 335 electrically couples the top metal plate 330 to a first supply rail 342 formed from interconnect metal layer M1, as discussed further below.

FIG. 3A also shows a via 352 disposed on the bottom metal plate 320. The via 352 electrically couples the bottom metal plate 320 to interconnect 372 formed from interconnect metal layer Mn, as discussed further below. The bottom metal plate 320 includes an extension 328 that extends laterally beyond the top metal plate 330. The via 352 is located on the extension 328 of the bottom metal plate 320, which allows the via 352 to extend vertically to reach interconnect 372 without hitting the top metal plate 330.

In the example shown in FIG. 3A, the bottom metal plate 320 is coupled to a second supply rail 344 formed from interconnect metal layer M(n−1) through a resistive path. The resistive path includes the via 352 and interconnect 372 discussed above. The resistive path also includes a first path 392, a second path 394, and interconnect 380.

The first path 392 includes a first set of vias 354, 356, 358 and 360, and interconnects 374, 376 and 378. Interconnects 374, 376 and 378 are formed from interconnect metal layers M(n−1), M(n−2) and M(n−3), respectively. Each of interconnects 374, 376 and 378 is disposed between a respective pair of vias of the first set of vias 354, 356, 358 and 360, and couples the respective pair of vias in series. In this manner, interconnects 374, 376 and 378 couple the first set vias 354, 356, 358 and 360 in series, as shown in FIG. 3A.

The second path 394 includes a second set of vias 362, 364 and 366, and interconnects 382 and 384. Interconnects 382 and 384 are formed from interconnect metal layers M(n−3) and M(n−2), respectively. Each of interconnects 382 and 384 is disposed between a respective pair of vias of the second set of vias 362, 364 and 366, and couples the respective pair of vias in series. In this manner, interconnects 382 and 384 couple the second set vias 362, 364 and 366 in series, as shown in FIG. 3A.

In this example, the first path 392 is coupled between interconnect 372 and interconnect 380, and the second path 394 is coupled between the second supply 344 and interconnect 380. The first path 392 and the second path 394 are coupled in series through interconnect 380. Thus, the resistive path in this example passes through series-connected vias 352, 354, 356, 358, 360, 362, 364 and 366. In the example shown in FIG. 3A, interconnect 380 is formed from interconnect metal layer M(n−4), which is below both interconnect 372 and the second supply rail 344. For example, interconnect 380 may be separated vertically from interconnect 372 by at least one intervening interconnect metal layer.

The resistance of the resistive path is at least equal to the sum of the resistances of vias 352, 354, 356, 358, 360, 362, 364 and 366 since these vias are coupled in series. The resistance of the resistive path may be increased (e.g., to achieve a desired RC time constant) by increasing the number of vias coupled in series.

It is to be appreciated that each of the vias 352, 354, 356, 358, 360, 362, 364 and 366 may be implemented with two or more vias coupled in parallel. For example, via 354 may be implemented with two or more vias coupled in parallel between interconnect 372 and interconnect 374. Thus, the term "via" as used herein is not limited to a single via and may include a vertical interconnect structure made up of multiple vias coupled in parallel.

In the above example, the first supply rail 342 may be a VDD rail and the second supply rail 344 may be a VSS rail, or vice versa.

Although the resistive path is coupled between the bottom metal plate 320 and the second supply rail 344 in the example shown in FIG. 3A, it is to be appreciated that the present disclosure is not limited to this example. For example, the resistive path may instead be coupled between the top metal plate 330 and the first supply rail 342. In another example, each of the bottom and top metal plates 320 and 330 may be coupled to the respective supply rail by a respective resistive path.

Figure 3B:
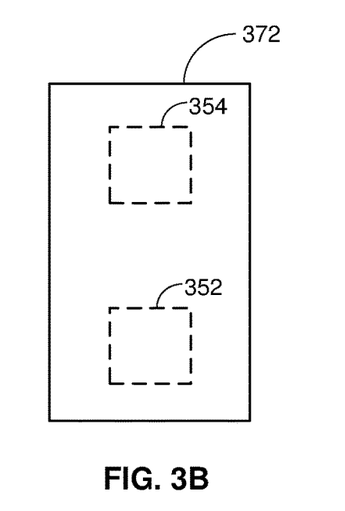
FIG. 3B shows a top view of an exemplary interconnect according to certain aspects of the present disclosure.

FIG. 3B shows a top view of one example of interconnect 372, in which the interconnect 372 provides a straight connection between vias 352 and 354. Note that vias 352 and 354 are shown with dashed lines in FIG. 3B to indicate that the vias 352 and 354 are under interconnect 372.

Figure 3C:
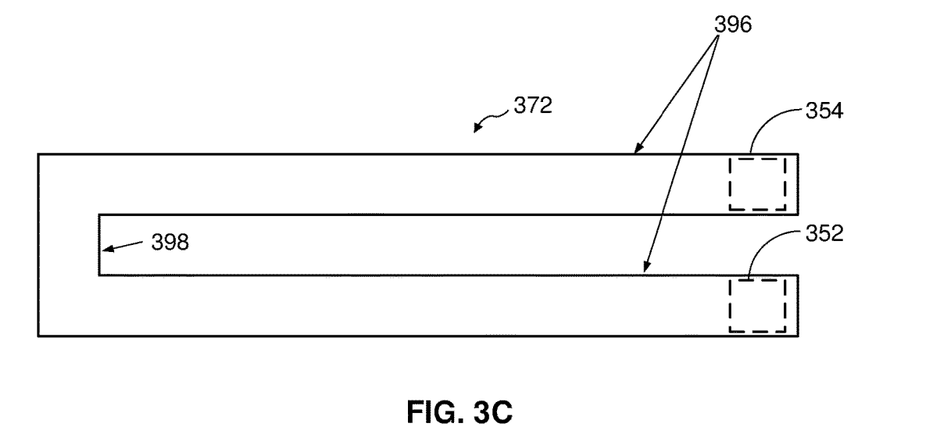
FIG. 3C shows an example in which the interconnect includes a long-narrow metal path to increase resistance according to certain aspects of the present disclosure.

FIG. 3C shows another example in which interconnect 372 is patterned to form a long-narrow winding metal path to further increase the resistance of the path between the bottom metal plate 320 and the second supply rail 344. One end of the winding metal path is coupled to via 352, and the other end of the winding metal path is coupled to via 354. In this example, the winding metal path includes elongated segments 396 that run parallel with one another and a connecting segment 398 connecting the elongated segments. Thus, the resistive path may include a combination of a long-narrow metal path and multiple vias coupled in series.

It is to be appreciated that the present disclosure is not limited to the example shown in FIG. 3C. For example, interconnect 380 may be patterned to form a long-narrow metal path with one end of the metal path coupled to via 360, and the other end of the metal path coupled to via 362.

In certain aspects of the present disclosure, multiple decoupling capacitors are coupled in parallel to form a large decoupling capacitor. This results in a larger capacitance, which reduces the amount of resistance needed to achieve the desired RC time constant discussed above.

An example of multiple decoupling capacitors coupled in parallel to form a large decoupling capacitor will now be described with reference to FIGS. 4 and 5A.

Figure 4:
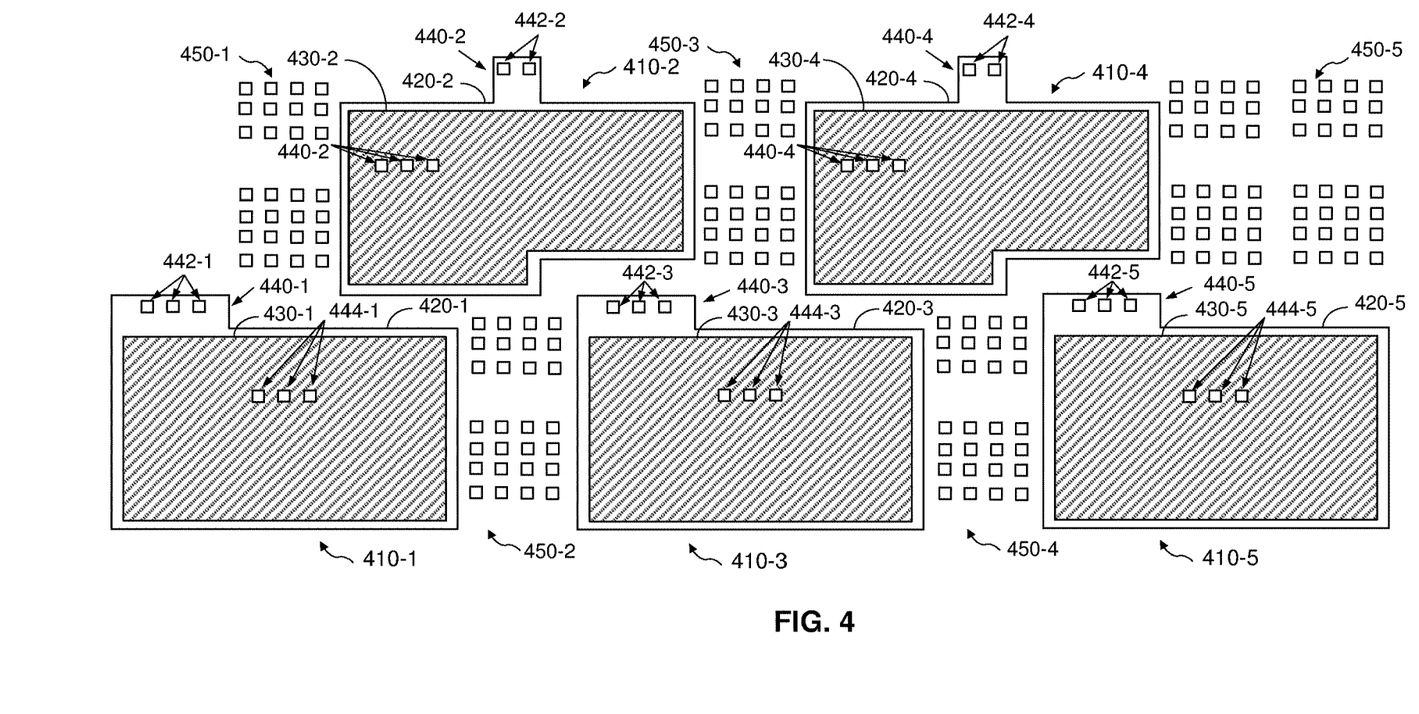
FIG. 4 shows a top view of an example of multiple decoupling capacitors distributed on a die according to certain aspects of the present disclosure.

FIG. 4 shows a top view of an example of multiple decoupling capacitors 410-1 to 410-5 on the die 110. The decoupling capacitors 410-1 to 410-5 may be disposed between interconnect metal layers M(n−1) and Mn shown in FIG. 1.

Each of the decoupling capacitors 410-1 to 410-5 includes a respective bottom metal plate 420-1 to 420-5, and a respective top metal plate 430-1 to 430-5 located above the respective bottom metal plate. In FIG. 4, the top metal plates 430-1 to 430-5 are shaded to better distinguish the top metal plates 430-1 to 430-5 from the bottom metal plates 420-1 to 420-5. Each of the decoupling capacitors 410-1 to 410-5 also includes an insulator (e.g., dielectric) layer between the respective metal plates 420-1 to 420-5 and 430-1 to 430-5. In the example shown in FIG. 4, the boundary of each bottom metal layer 420-1 to 420-5 extends slightly beyond the boundary of the respective top metal layer 430-1 to 430-5. The bottom metal plates 420-1 to 420-5 are formed from a first metal layer between interconnect metal layers Mn and M(n−1), and the top metal plates 430-1 to 430-5 are formed from a second metal layer between interconnect metal layers Mn and M(n−1).

In this example, the die 110 includes vias 444-1 to 444-5 disposed on the top metal plate 430-1 to 430-5 of each of the decoupling capacitors 410-1 to 410-5. The vias 444-1 to 44-5 for each of the decoupling capacitors 410-1 to 410-5 are used to electrically couple the respective top metal plate 430-1 to 430-5 to a respective supply rail (e.g., VDD rail) of the power grid. The die 110 also includes vias 442-1 to 442-5 disposed on the bottom metal plate 420-1 to 420-5 of each of the decoupling capacitors 410-1 to 410-5. The vias 442-1 to 442-5 for each of the decoupling capacitors 410-1 to 410-5 are used to electrically couple the respective bottom metal plate 420-1 to 420-5 to a respective supply rail (e.g., VSS rail). Each of the bottom metal plates 420-1 to 420-5 includes a respective extension 440-1 to 440-5 that extends beyond the respective top metal plate 430-1 to 430-5. The vias 442-1 to 442-5 for each of the decoupling capacitors 410-1 to 410-5 are located on the extension 440-1 to 440-5 of the respective bottom metal plate 420-1 to 420-5.

As shown in FIG. 4, the decoupling capacitors 410-1 to 410-5 are spaced apart by clusters of vias 450-1 to 450-5 distributed on the die 110. These vias 450-1 to 450-5 are used for power and/or signal routing on the die 110. In one example, each of the decoupling capacitors 410-1 to 410-5 has a capacitance of a few pico-farads (pF). In this example, a resistance on the order of a few kilo-ohms may be required to achieve a desired RC time constant (e.g., a few nanoseconds) for dampening noise at a resonance frequency of the PDN.

Figure 5A:
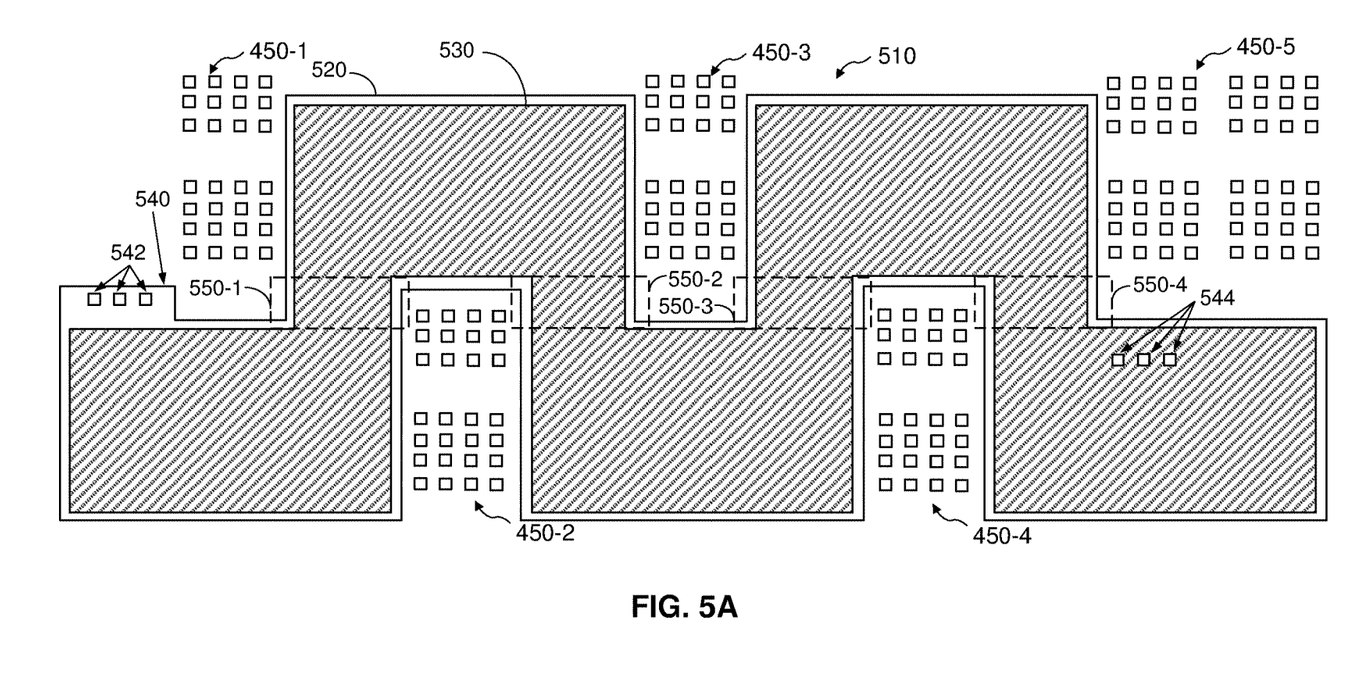
FIG. 5A shows an example in which the multiple decoupling capacitors are coupled in parallel to form a large decoupling capacitor according to certain aspects of the present disclosure.

FIG. 5A shows an example in which the multiple decoupling capacitors 410-1 to 410-5 shown in FIG. 4 are coupled in parallel to form a large decoupling capacitor 510. The decoupling capacitors 410-1 to 410-5 may be coupled using wide low-resistance metal traces. More particularly, the bottom metal plates 420-1 and 420-2 of decoupling capacitors 410-1 and 410-2 are coupled by a wide metal trace within area 550-1, the bottom metal plates 420-2 and 420-3 of decoupling capacitors 410-2 and 410-3 are coupled by a wide metal trace within area 550-2, the bottom metal plates 420-3 and 420-4 of decoupling capacitors 410-3 and 410-4 are coupled by a wide metal trace within area 550-3, and the bottom metal plates 420-4 and 420-5 of decoupling capacitors 410-4 and 410-5 are coupled by a wide metal trace within area 550-4. The wide metal traces are formed from the same metal layer as the bottom metal plates 420-1 to 420-5. Thus, the wide metal traces are contiguous with the bottom metal plates 420-1 to 420-5, resulting in a single large bottom metal plate 520.

Similarly, the top metal plates 430-1 and 430-2 of decoupling capacitors 410-1 and 410-2 are coupled by a wide metal trace within area 550-1, the top metal plates 430-2 and 430-3 of decoupling capacitors 410-2 and 410-3 are coupled by a wide metal trace within area 550-2, the top metal plates 430-3 and 430-4 of decoupling capacitors 410-3 and 410-4 are coupled by a wide metal trace within area 550-3, and the top metal plates 430-4 and 430-5 of decoupling capacitors 410-4 and 410-5 are coupled by a wide metal trace within area 550-4. The wide metal traces are formed from the same metal layer as the top metal plates 430-1 to 430-5. Thus, the wide metal traces are contiguous with the top metal plates 430-1 to 430-5, resulting in large single top metal plate 530.

In the example in FIG. 5A, five decoupling capacitors 410-1 to 410-5 are coupled in parallel to form the large capacitor 510. As a result, the large capacitor 510 has a capacitance that is approximately five time greater than the capacitance of an individual decoupling capacitor. This reduces the resistance needed to achieve a desired RC time constant by a factor of five. For example, if the required resistance for the desired RC time constant is on the order of a few kilo-ohms for an individual decoupling capacitor, then the required resistance can be on the order of a few hundred-ohms for the large decoupling capacitor 510. As the number of capacitors that are coupled in parallel increases, the required resistance to achieve a desired RC time constant decreases proportionally.

As shown in FIG. 5A, the large capacitor 510 does not interfere with the distribution of the vias 450-1 to 450-5 shown in FIG. 4, which provide power and/or signal routing between interconnect metal layers Mn and M(n−1). In this regard, the boundary of the large capacitor 510 curves around vias 450-2, 450-3 and 450-4 on at least three sides so as not to interfere with the placement of these vias on the die 110.

In example shown in FIG. 5A, the die 110 includes vias 544 disposed on the top metal plate 530 of the large capacitor 510. The vias 544 are used to electrically couple the top metal plate 530 to a supply rail (not shown in FIG. 5A). The vias 544 may be coupled to the supply rail through a resistive path or directly coupled to the supply rail. The die 110 in this example also includes vias 542 disposed on the bottom metal plate 520 of the large capacitor 510. The vias 542 are used to electrically couple to the bottom metal plate 520 to another supply rail (not shown in FIG. 5A). The vias 542 may be coupled to the other supply rail through a resistive path or directly coupled to the supply rail. As shown in FIG. 5A, the bottom metal plate 542 includes an extension 540 that extends beyond the top metal plate 530, in which the vias 542 are located on the extension 540.

Figure 5B:
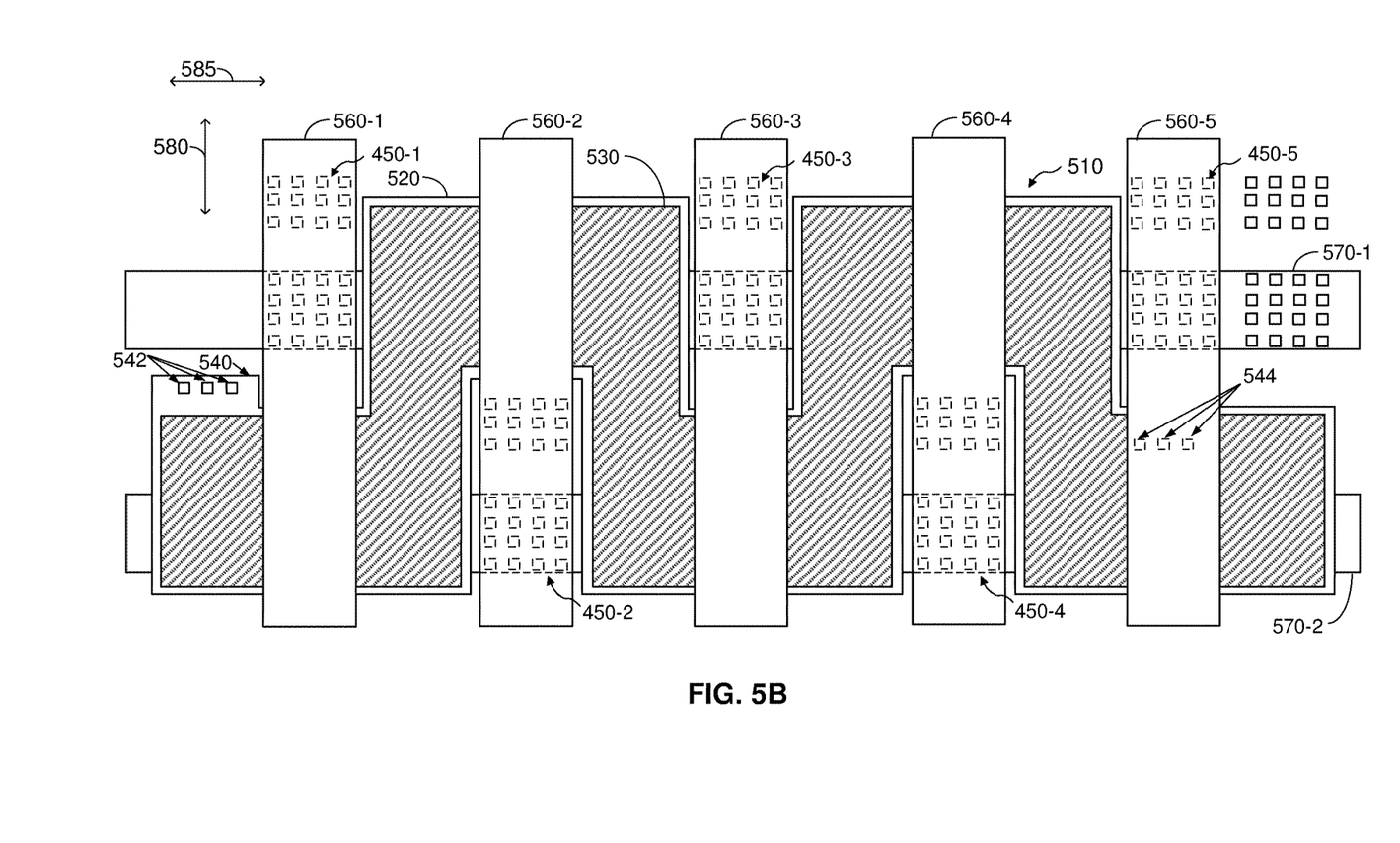
FIG. 5B shows an example of supply rails located above and below the large decoupling capacitor according to certain aspects of the present disclosure.

FIG. 5B also shows an example of a first set of supply rails 560-1 to 560-5 formed from interconnect metal layer Mn, and a second set of supply rails 570-1 and 570-2 formed from interconnect metal layer M(n−1). The first set of supply rails 560-1 to 560-5 extend above the large decoupling capacitor 510 in lateral direction 580. The second set of supply rails 570-1 and 570-2 extend underneath the large decoupling capacitor 510 in lateral direction 585. In this example, supply rail 570-1 is coupled to supply rails 560-1, 560-3 and 560-5 by vias 450-1, 450-3 and 450-5, respectively. Supply rail 570-2 is coupled to supply rails 560-2 and 560-4 by vias 450-2 and 450-4, respectively. In FIG. 5B, the vias underneath supply rails 560-1 to 560-5 are shown with dashed lines.

In this example, the top metal plate 530 is coupled to supply rail 560-5 by the vias 544 disposed on the top metal plate 530. The supply rail 560-5 may be a VDD rail or a VSS rail.

The bottom metal plate 520 may be coupled to another supply rail through a resistive path (not shown in FIG. 5B). The other supply rail may be a VSS rail if supply rail 560-5 is a VDD rail, and a VDD rail if supply rail 560-5 is a VSS rail. In this example, one end of the resistive path is coupled to the vias 542 disposed on the bottom metal plate 520 and the other end of the resistive path is coupled to the other supply rail. The resistive path may include a long-narrow metal path (e.g., shown in FIGS. 2B and 3C), multiple vias coupled in series (e.g., shown in FIG. 3A), or a combination of both. In this example, the increased capacitance provided by the large decoupling capacitor 510 and the increased resistance provided by the resistive path are used in combination to achieve a desired RC time constant (e.g., a few nanoseconds) to effectively dampen noise at a resonance frequency of the PDN.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two components.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

It is to be understood that present disclosure is not limited to the terminology used above to describe aspects of the present disclosure. For example, it is to be appreciated that metal interconnect layers may also be referred to as metallization layers, or another terminology. In another example, it is to be appreciated that a power grid may also be referred to as a power mesh, or another terminology. In yet another example, metal plates of a decoupling capacitor may also be referred to as electrodes, or another terminology.

Although aspects of the present disclosure are described above using the convention in which the bottom-most interconnect metal layer in the BEOL is labeled M1, it is to be appreciated that the present disclosure is not limited to this convention. For example, the present disclosure also covers the convention in which the bottom-most metal layer in the BEOL is labeled M0. In this example, the metal interconnect layer immediately above metal interconnect layer M0 is labeled M1, the metal interconnect layer immediately above metal interconnect layer M1 is labeled M2, and so forth.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A semiconductor die, comprising:
   a decoupling capacitor between a first interconnect metal layer and a second interconnect metal layer of the die;
   a first supply rail formed from the second interconnect metal layer; and
   a resistive metal path coupled between the decoupling capacitor and the first supply rail, wherein the resistive metal path comprises:
      a first interconnect coupled to the decoupling capacitor;
      a second interconnect below the first interconnect and the first supply rail;
      a first path comprising a first plurality of vias coupled in series, wherein the first path is coupled between the first interconnect and the second interconnect; and
      a second path comprising a second plurality of vias coupled in series, wherein the second path is coupled between the first supply rail and the second interconnect.

2. The semiconductor die of claim 1, wherein the decoupling capacitor comprises:
   a first metal plate;
   a second metal plate; and
   an insulator layer between the first and second metal plates;
   wherein the resistive metal path is coupled between the first metal plate and the first supply rail.

3. The semiconductor die of claim 2, further comprising a second supply rail, wherein a second metal plate is coupled to the second supply rail.

4. The semiconductor die of claim 1, wherein the first interconnect comprises a winding path comprising:
   a plurality of elongated segments; and
   one or more connecting segments, wherein each of the one or more connecting segments electrically couples a respective pair of the plurality of elongated segments, and the winding path is coupled in series with the first plurality of vias.

5. The semiconductor die of claim 4, wherein the plurality of elongated segments are orientated along a first lateral direction, the one or more connecting segments are orientated along a second lateral direction, and the first lateral direction is approximately perpendicular to the second lateral direction.

6. The semiconductor die of claim 1, wherein the first and second interconnect metal layers are separated vertically from a front end of line (FEOL) of the die by at least five intervening interconnect metal layers of the die.

7. The semiconductor die of claim 1, wherein the second interconnect is separated vertically from the first interconnect by at least one intervening metal interconnect layer of the die.

8. The semiconductor die of claim 1, further comprising a via coupled between the decoupling capacitor and the first interconnect.

9. The semiconductor die of claim 1, wherein the decoupling capacitor comprises a metal-insulator-metal (MIM) capacitor.

10. The semiconductor die of claim 1, wherein the first plurality of vias comprises at least three vias coupled in series.

11. A semiconductor die, comprising:
a decoupling capacitor between a first interconnect metal layer and a second interconnect metal layer of the die, wherein the decoupling capacitor comprises multiple capacitors coupled in parallel;
a first supply rail formed from the second interconnect metal layer, wherein the first supply rail is coupled to the decoupling capacitor;
a second supply rail formed from the first interconnect metal layer;
a third supply rail formed from the second interconnect metal layer; and
a plurality of vias between two of the multiple capacitors, wherein each of the plurality of vias is coupled between the second supply rail and the third supply rail.

12. The semiconductor die of claim 11, further comprising a resistive path coupled between the decoupling capacitor and the first supply rail.

13. The semiconductor die of claim 12, wherein the resistive path comprises a plurality of vias coupled in series.

14. The semiconductor die of claim 12, wherein the resistive path comprises:
a plurality of elongated segments; and
one or more connecting segments, wherein each of the one or more connecting segments electrically couples a respective pair of the plurality of elongated segments.

15. The semiconductor die of claim 11, wherein the first and second interconnect metal layers are separated vertically from a front end of line (FEOL) of the die by at least five intervening interconnect metal layers of the die.

16. The semiconductor die of claim 11, wherein the multiple capacitors comprise multiple metal-insulator-metal (MIM) capacitors.

17. The semiconductor die of claim 11, wherein:
each of the multiple capacitors comprises a respective metal plate;
the decoupling capacitor comprises a plurality of metal traces electrically coupling the metals plates of the multiple capacitors; and
the metal traces and the metal plates of the multiple capacitors are formed from a same metal layer.

* * * * *